United States Patent
Osanai

(10) Patent No.: US 9,874,614 B2
(45) Date of Patent: Jan. 23, 2018

(54) SEMICONDUCTOR APPARATUS AND POWER CONVERSION APPARATUS

(71) Applicant: TOYOTA JIDOSHA KABUSHIKI KAISHA, Toyota-shi, Aichi-ken (JP)

(72) Inventor: Yosuke Osanai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 119 days.

(21) Appl. No.: 14/722,904

(22) Filed: May 27, 2015

(65) Prior Publication Data

US 2016/0011266 A1    Jan. 14, 2016

(30) Foreign Application Priority Data

Jul. 14, 2014  (JP) .................................. 2014-144420

(51) Int. Cl.
G01R 31/42      (2006.01)
G01R 31/327     (2006.01)

(52) U.S. Cl.
CPC .......... *G01R 31/42* (2013.01); *G01R 31/3277* (2013.01)

(58) Field of Classification Search
None
See application file for complete search history.

(56) References Cited

U.S. PATENT DOCUMENTS

| 8,006,678 B2* | 8/2011 | Naito ............. F02P 3/0552 123/143 R |
| 2009/0160476 A1 | 6/2009 | Omaru |
| 2011/0050270 A1 | 3/2011 | Miyazaki |
| 2011/0163706 A1* | 7/2011 | Miura ............ H02M 7/53875 318/400.27 |
| 2013/0207712 A1* | 8/2013 | Suzuki ............ H03K 17/165 327/379 |
| 2014/0098581 A1 | 4/2014 | Takizawa |
| 2016/0233788 A1* | 8/2016 | Osanai ............. H02M 1/08 |

FOREIGN PATENT DOCUMENTS

| CN | 101414816 A | 4/2009 |
| JP | 2009-019953 A | 1/2009 |
| JP | 2009-159671 A | 7/2009 |
| JP | 2014-079037 A | 5/2014 |

* cited by examiner

*Primary Examiner* — Paresh Patel
(74) *Attorney, Agent, or Firm* — Oliff PLC

(57) ABSTRACT

There is provided a semiconductor apparatus comprising: a switching element including a main element and a sense element; a main diode whose cathode is connected to a first main electrode of the main element and whose anode is connected to a second main electrode of the main element; a sense diode whose cathode is connected to a first main electrode of the sense element and whose anode is connected to a second main electrode of the sense element; and a deterioration detection circuit configured to apply a voltage to a sense node, and detects a deterioration of the switching element or the main diode based on a forward current flowing in the sense diode, being detected while the voltage is applied, the voltage being applied during an OFF period of switching element, wherein the sense diode is disposed for detecting current flowing through the main diode.

13 Claims, 10 Drawing Sheets

US 9,874,614 B2

SEMICONDUCTOR APPARATUS AND POWER CONVERSION APPARATUS

BACKGROUND OF THE INVENTION

1. Field of the Invention

The disclosure is related to a semiconductor apparatus and a power conversion apparatus.

2. Description of the Related Art

A failure detection device for detecting a deterioration of a switching element is known (for example, Japanese Laid-open Patent Publication No. 2009-159671). The detection device includes a high withstand voltage diode element, which is specifically used for fault detection, connected externally with the collector of the switching element, and detects the deterioration of the switching element based on a voltage detected through the high withstand voltage diode.

However, in the aforementioned conventional art, the diode element specifically used for fault detection is required to detect the deterioration.

RELATED ART DOCUMENT

Patent Document

[Patent Document 1] Japanese Laid-open Patent Publication No. 2009-159671

SUMMARY OF THE INVENTION

An object of the present disclosure is to provide a semiconductor apparatus and a power conversion apparatus capable of detecting deterioration without a diode dedicated to fault detection.

The following configuration is adopted to achieve the aforementioned object.

In one aspect of the embodiment, there is provided a semiconductor apparatus comprising: a switching element including a main element and a sense element; a main diode whose cathode is connected to a first main electrode of the main element and whose anode is connected to a second main electrode of the main element; a sense diode whose cathode is connected to a first main electrode of the sense element and whose anode is connected to a second main electrode of the sense element; and a deterioration detection circuit configured to apply a voltage to a sense node at which the second main electrode of the sense element and the anode of the sense diode are connected, and detects a deterioration of the switching element or the main diode based on a forward current flowing in the sense diode, the forward current being detected while the voltage is applied, the voltage being applied during an OFF period of the switching element, wherein the sense diode is disposed for detecting current that flows through the main diode.

Other objects, features and advantages of the present invention will become more apparent from the following detailed description when read in conjunction with the accompanying drawings.

DETAILED DESCRIPTION OF THE PREFERRED EMBODIMENTS

In the following, embodiments are described in detail with reference to appended drawings.

Figure 1:
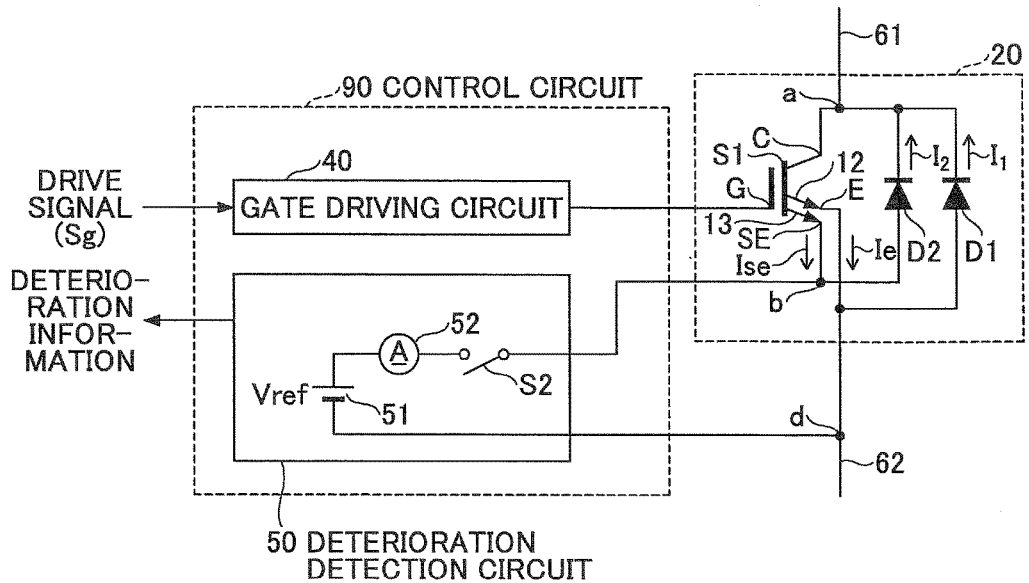
FIG. 1 is a diagram for illustrating an example configuration of a semiconductor apparatus.

FIG. 1 is a diagram for illustrating an example configuration of a driving apparatus 1 which is an example of a semiconductor apparatus. The driving apparatus 1 includes a switching element S1, a main diode D1, a sense diode D2 and a deterioration detection circuit 50.

The switching element S1 includes a main transistor 12 and a sense transistor 13. The main transistor 12 is an example of a main element and the sense transistor 13 is an example of a sense element formed in a smaller size than the main element.

The main diode D1 includes a cathode connected with a collector electrode of the main transistor 12 and an anode connected with an emitter electrode of the main transistor 12. The collector electrode of the main transistor 12 is an example of a first main electrode of the main element and is connected with the collector terminal C of the switching element S1. The emitter electrode of the main transistor 12 is an example of a second main electrode of the main element and is connected with the emitter terminal E of the switching element S1.

The sense diode D2 includes a cathode connected with a collector electrode of the sense transistor 13 and an anode connected with a sense-emitter electrode of the sense transistor 13. The collector electrode of the sense transistor 13 is an example of a first main electrode of the sense element and is connected with a collector terminal C of the switching element S1. The sense-emitter electrode of the sense transistor 13 is an example of a second main electrode of the sense element and is connected with a sense-emitter terminal SE of the switching element S1.

The deterioration detection circuit 50 is an example of a detection circuit configured to apply a voltage Vref to a sense node "b" within an OFF period of the switching element S1, thereby detecting the deterioration of the switching element S1 or the main diode D1 based on forward current $I_2$ flowing in the sense diode D2. The sense node "b" is a connection point at which the sense-emitter electrode of the sense transistor 13 and the anode of the sense diode D2 are connected with each other. The forward current $I_2$ is current flowing in the sense diode D2 in a forward direction.

Additionally, the OFF period of the switching element S1 means a period in which a voltage Vge for switching off the switching element S1 is applied to gate terminals (control terminals) of the main transistor 12 and the sense transistor 13 through a gate terminal G of the switching element S1. The main transistor 12 and the sense transistor 13 are switched off while the gate voltage Vge for switching off the switching element S1 is applied to their gate terminals.

Deterioration in at least one of the main transistor 12 and the sense transistor 13 is included in the deterioration of the switching element S1. Also, a short-circuiting fault may be included in the deterioration.

Upon the voltage Vref being applied to the sense node "b" during the OFF period of the switching element S1, a voltage (Vref−VF2) is applied to the collector electrode of the main transistor 12 and the sense transistor 13 and the cathode of the main diode D1. The VF2 is a forward voltage of the sense diode D2. The voltage Vref is greater than the forward voltage VF2.

In a case where the main transistor 12 is deteriorated, the forward current $I_2$ leaks from the collector electrode to the emitter electrode of the main transistor 12 in response to the voltage (Vref−VF2) being applied to the main transistor 12, even if the main transistor 12 is switched off. In a case where the sense transistor 13 is deteriorated, the forward current $I_2$ leaks from the collector electrode to the sense-emitter electrode of the sense transistor 13 in response to the voltage (Vref−VF2) being applied to the sense transistor 13, even if the sense transistor 13 is switched off. In a case where the main diode D1 is deteriorated, the forward current $I_2$ leaks from the cathode to the anode of the main diode D1 in response to the voltage (Vref−VF2) being applied to the main diode D1.

That is, in a case where at least one of the switching element S1 and the main diode D1 is deteriorated, the forward current $I_2$ flows in the sense diode D2 in response to the voltage Vref being applied to the sense node "b" during the OFF period of the switching element S1. Meanwhile, in a case where not any of the main transistor 12, the sense transistor 13 and the main diode D1 are deteriorated, the forward current $I_2$ does not flow in the sense diode D2 in response to the voltage Vref being applied to the sense node "b" during the OFF period of the switching element S1.

Therefore, for example, the deterioration detection circuit 50 can determine that at least one of the switching element S1 and the main diode D1 is deteriorated in a case where the flow of forward current $I_2$ in the sense diode D2 during the OFF period of the switching element S1 is detected. Meanwhile, for example, the deterioration detection circuit 50 can determine that neither the switching element S1 nor the main diode D1 is deteriorated in a case where the flow of forward current $I_2$ in the sense diode D2 during the OFF period of the switching element S1 is not detected.

As described above, since the sense diode D2 for detecting the current flow in the main diode D1 can be diverted to detecting the deterioration, the deterioration can be detected without another diode element dedicated to fault detection. The sense diode D2 is disposed in a chip 20 where the switching element S1 is disposed. Thus, the sense diode D2 disposed in the same chip where the switching element S1 is disposed is used for detecting the deterioration. Therefore, for example, a distance between the sense diode D2 and the switching element S1 is likely to be short in comparison to a configuration where the sense diode is disposed in a separate chip from the switching element, thereby enabling to downsize a circuit scale of the driving apparatus 1.

Also, the main diode D1 may be disposed in the same chip where the switching element S1 is disposed. Thus, for example, a distance between the main diode D1 and the switching element S1 or the sense diode D2 is likely to be short in comparison to a configuration where the main diode D1 is disposed in a chip other than the chip 20, thereby further enabling to downsize a circuit scale of the driving apparatus 1.

In the following, the configuration shown in FIG. 1 is further described in detail.

The driving apparatus 1 is a semiconductor circuit including a means for driving an inductive load (for example, an inductor, motor, etc.) which is connected to a first inducting unit 61 or a second inducting unit 62 where the inductive load is driven by switching on/off the switching element S1.

For example, the inducting unit 61 is a current pass electrically connected with a high power supply potential part such as a positive electrode of the power supply and may be indirectly connected to the high power supply potential part through a switching element or a load. For example, the inducting unit 62 is a current pass electrically connected with a low power supply potential part such as a negative electrode of the power supply (for example, a ground potential part) and may be indirectly connected to the low power supply potential part through a switching element or a load.

For example, a power conversion apparatus for converting electric power between input and output thereof by switching on/off the switching element S1 is exemplified as an apparatus in which one or more driving apparatuses are used. A converter for stepping-up or stepping-down the DC power, an inverter for converting electric power between the DC power and the AC power, and the like are exemplified as the power conversion apparatus.

The switching element S1 is an insulated gate voltage controlled semiconductor element with current sense function, and is, for example, an IGBT (Insulated Gate Bipolar Transistor) having a gate terminal G, a collector terminal C, an emitter terminal E, and a sense-emitter terminal SE.

For example, the gate terminal G is a control terminal connected with the gate driving circuit 40. For example, the collector terminal C is a first main terminal connected with a connection node "a" and connected to the inducting unit 61 through the connection node "a". For example, the emitter terminal E is a second main terminal connected with a connection node "d" and connected to the inducting unit 62 through the connection node "d". The sense-emitter terminal SE is a sense terminal connected with the sense node "b" and connected to the deterioration detection circuit 50 through the sense node "b".

The switching element S1 includes the main transistor 12 and the sense transistor 13. The main transistor 12 and the sense transistor 13 are switching elements such as the IGBT. The main transistor 12 and the sense transistor 13 may be a plurality of cell transistors.

The respective gate electrodes of the main transistor 12 and the sense transistor 13 are control electrodes commonly connected with the gate terminal G of the switching element S1. The respective collector electrodes of the main transistor 12 and the sense transistor 13 are first main electrodes commonly connected with the collector terminal C of the switching element S1. The emitter electrode of the main transistor 12 is a second main electrode connected with the emitter terminal E of the switching element S1. The sense-emitter terminal of the sense transistor 13 is a sense electrode connected with the sense-emitter terminal SE of the switching element S1.

The main transistor 12 is an example of a switching element. The sense transistor 13 is an example of a sense element for generating current corresponding to current flowing in the main transistor 12, where greater current flows (is generated) in the sense element when the current flowing in the main transistor 12 becomes greater. For example, the sense transistor 13 outputs sense current Ise proportional to main current Ie flowing in the main transistor 12, where the sense current Ise corresponding to the main current Ie is smaller than the main current Ie.

For example, collector current flowing from the collector terminal C into the switching element S1 is divided by a sense ratio of "m" into the main current Ie flowing in the main transistor 12 and the sense current Ise flowing in the sense transistor 13. The sense current Ise corresponding to the main current Ie is generated by using the sense ratio "m" so as to reduce the value of sense current Ise by the sense ratio "m" to be smaller than that of the main current Ie. The sense ratio "m" is defined according to a ratio between an area of the emitter electrode of the main transistor 12 and an area of the sense-emitter electrode of the sense transistor 13.

The main current Ie flows through the collector electrode and the emitter electrode of the main transistor 12 to be output from the emitter terminal E. The main current Ie output from the emitter terminal E flows through the connection node "d" into the inducting unit 62. The main current Ie is backward current opposite to diode current $I_1$ flowing in a forward direction in the main diode D1.

The sense current Ise flows through the collector electrode and the sense-emitter electrode of the sense transistor 13 to be output from the sense-emitter terminal SE. The sense current Ise output from the sense-emitter terminal SE flows through the sense node "b" and a control circuit 90 into the inducting unit 62. The sense current Ise is backward current opposite to sense diode current $I_2$ flowing in a forward direction in the sense diode D2.

The main diode D1 is a rectifier element connected reversely in parallel with the main transistor 12, and for example, includes the anode connected with the emitter terminal E and the cathode connected with the collector terminal C. The anode of the main diode D1 is a P-type electrode connected with the connection node "d" with which the emitter terminal E is connected and connected through the connection node "d" to the inducting unit 62. The cathode of the main diode D1 is an N-type electrode connected with the connection node "a" with which the collector terminal C is connected and connected through the connection node "a" to the inducting unit 61.

The sense diode D2 is a rectifier element connected reversely in parallel with the sense transistor 13, and for example, includes the anode connected with the sense-emitter terminal SE and the cathode connected with the collector terminal C. The anode of the sense diode D2 is a P-type electrode connected with the sense node "b" with which the sense-emitter terminal SE is connected and connected through the sense node "b" to a voltage output unit of the deterioration detection circuit 50. The cathode of the sense diode D2 is a N-type electrode connected with the connection node "a" with which the collector terminal C is connected and connected through the connection node "a" to the inducting unit 61.

The driving apparatus 1 includes a control circuit 90 for driving the switching element S1 and detecting the deterioration thereof. For example, the control circuit 90 is a semiconductor circuit formed in a chip other than the chip 20, including the deterioration detection circuit 50 and the gate driving circuit 40. Additionally, the control circuit 90 may be formed in the chip 20.

For example, the deterioration detection circuit 50 includes a voltage source 51, a current measuring unit 52 and a switch S2 respectively connected in series. For example, the voltage source 51 is a circuit for generating a fixed voltage Vref to apply it to the sense node "b" during the OFF period of the switching element S1. For example, the current measuring unit 52 is a circuit for measuring the forward current $I_2$ by detecting current output from the voltage source 51. For example, the switch S2 is a transistor being switched on when the deterioration is detected in the OFF period of the switching element S1 and being switched off when the deterioration is not detected in the ON period of the switching element S1. The voltage Vref is applied to the sense node "b" when the switch S2 is switched on while the voltage Vref is not applied to the sense node "b" when the switch S2 is switched off.

For example, the deterioration detecting circuit 50 determines that at least one of the switching element S1 and the main diode D1 is deteriorated in a case where the current measuring unit 52 measures the forward current $I_2$ which is greater than a predetermined current value Ith1. For example, the current value Ith1 is a value greater than or equal to "0". Meanwhile, the deterioration detecting circuit 50 determines that neither the switching element S1 nor the main diode D1 is deteriorated in a case where the current measuring unit 52 measures the forward current $I_2$ which is less than a predetermined current value Ith2. The current value Ith2 is a value equal to or less than the current value Ith1.

For example, by turning off the switch S2, the deterioration detection circuit 50 stops applying the voltage Vref to the sense node "b" during the ON period of the switching element S1. Thus, flow of current from the voltage source 51 into the sense node "b" during the ON period of the switching element S1 is prevented, and applying the voltage Vref to the sense node "b" during the ON period of the switching element S1 is also prevented.

For example, the deterioration detection circuit 50 outputs deterioration information indicating that the switching element S1 or the main diode D1 is deteriorated, according to current value of the forward current $I_2$ measured by the current measuring unit 52. For example, the deterioration information of the switching element S1 or the main diode D1 may be a measured value of the forward current $I_2$, or it may be a flag (for example, "1") or a logic level (for example, "High level") indicating the deterioration of the switching element S1 or the main diode D1. Also, the deterioration information may indicate a deterioration progress degree.

The gate driving circuit 40 switches on/off the switching element S1 according to a drive signal Sg. The drive signal Sg is an instruction signal (for example, a pulse width modulation signal) for instructing to switch on/off the switching element S1 which is provided from a control apparatus externally connected to the driving apparatus 1 in higher order than the drive apparatus 1. For example, the control apparatus is a microcomputer or an apparatus including a microcomputer.

Figure 2:
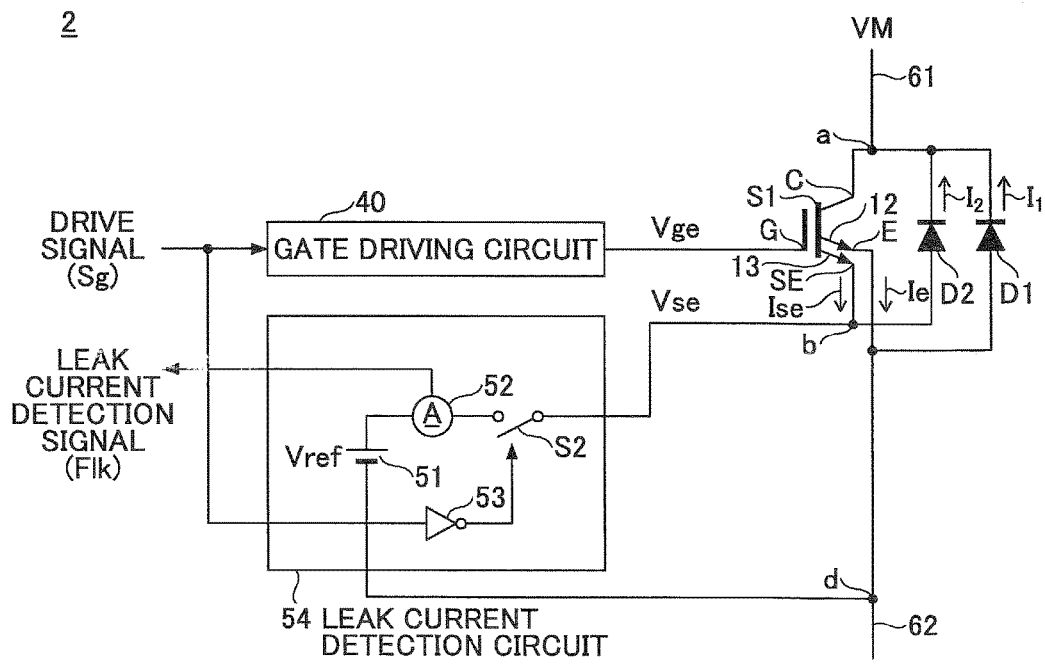
FIG. 2 is a diagram for illustrating another example configuration of a semiconductor apparatus.

FIG. 2 is a diagram for illustrating an example configuration of the driving apparatus 2 which is an example of the semiconductor apparatus. Description on a similar configuration or a similar effect to the aforementioned embodiment is omitted.

A leak current detection circuit 54 is an example of the aforementioned deterioration detection circuit 50. The leak current detection circuit 54 applies the voltage Vref to the sense node "b" during the OFF period of the switching element S1 to measure the forward current $I_2$ flowing in response to occurrence of leak current in the switching element S1 or the main diode D1, thereby detecting (leak detection) at least one of the deterioration of the switching element S1 and the deterioration of the diode D1.

For example, the leak current detection circuit 54 switches on the switch S2 according to the drive signal Sg for switching off the switching element S1, and thereby applies the voltage Vref to the sense node "b" during the OFF period of the switching element S1. Thus, the voltage Vref is appropriately applied during the OFF period of the switching element S1 since the voltage Vref is applied in synchronization with a "switch-off" instruction of the drive signal Sg.

Meanwhile, for example, the leak current detection circuit 54 switches off the switch S2 according to the drive signal Sg for switching on the switching element S1, and thereby stops applying the voltage Vref to the sense node "b" during the ON period of the switching element S1. Thus, the voltage Vref is appropriately stopped during the ON period of the switching element S1 since applying the voltage Vref is stopped in synchronization with a "switch-on" instruction of the drive signal Sg.

Additionally, the ON period of the switching element S1 means a period in which the gate voltage Vge for switching on the switching element S1 is provided to the gate electrode (control electrode) of the main transistor 12 and the sense transistor 13 through the gate terminal G of the switching element S1. The main transistor 12 and the sense transistor 13 are switched on while the gate voltage Vge for switching on the switching element S1 is applied to their gate terminals.

For example, the leak current detection circuit 54 includes an inverter circuit 53 for switching on/off the switch S2 by a signal generated by inverting the level of the drive signal Sg.

The leak current detection circuit 54 outputs a leak current detection signal Flk corresponding to the measured value of the forward current $I_2$. For example, the leak current detection circuit 54 outputs the leak current detection signal Flk with high level indicating a current leak in the switching element S1 or the main diode D1 (i.e. the deterioration information) in a case where the current measuring unit 52 measures the forward current $I_2$ which is greater than the predetermined current value Ith1. Meanwhile, for example, the leak current detection circuit 54 outputs the leak current detection signal Flk with low level indicating non-current-leak in the switching element S1 or the main diode D1 in a case where the current measuring unit 52 measures the forward current $I_2$ which is less than the predetermined current value Ith2.

Figure 3:
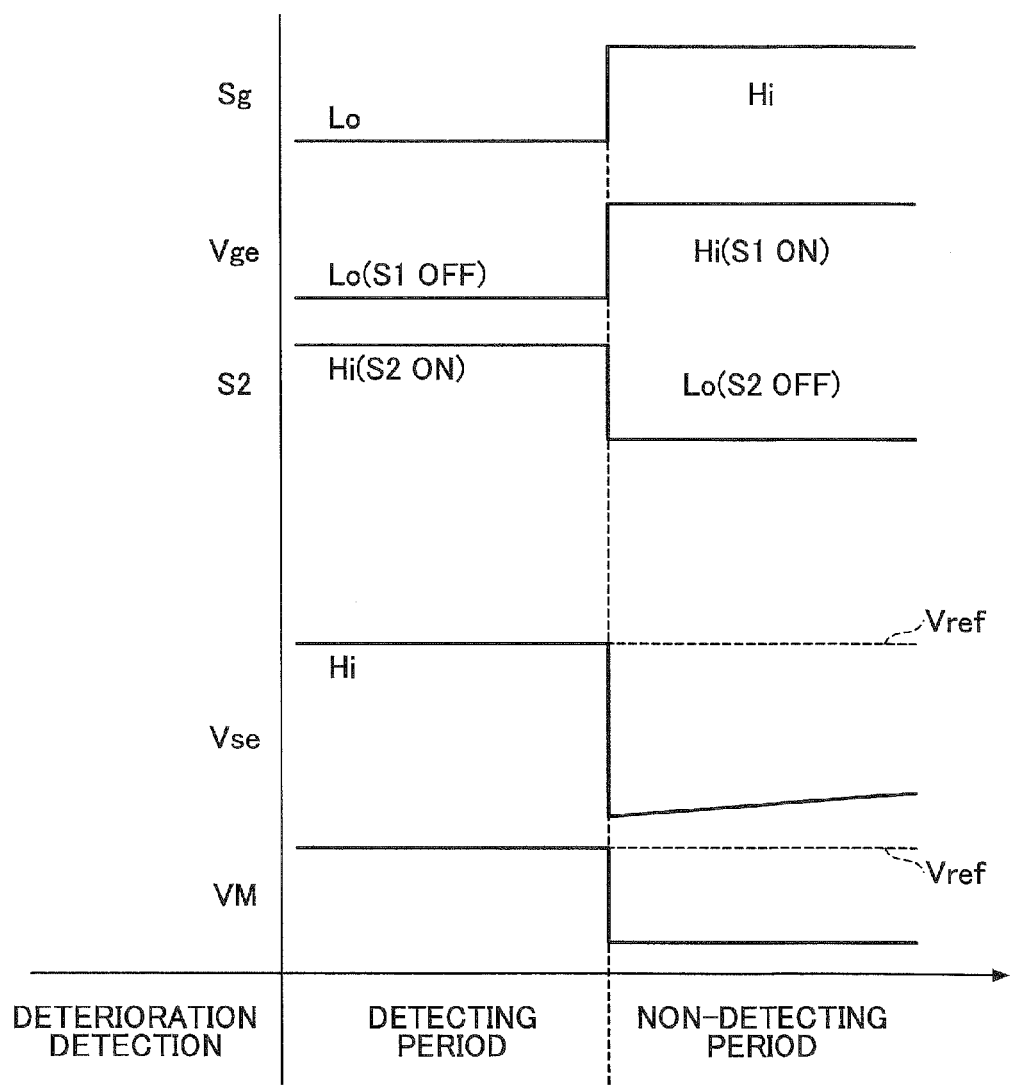
FIG. 3 is a timing diagram for illustrating an example of an operational waveform of the semiconductor apparatus.

FIG. 3 is a timing diagram for illustrating an example of an operational waveform of the driving apparatus 2. The low level drive signal Sg is for switching off the switching element S1 while the high level drive signal Sg is for switching on the switching element S1.

The gate driving circuit 40 sets the gate voltage Vge of the gate terminal G to be a low level so as to switch off the switching element S1 when the drive signal Sg is low. The leak current detection circuit 54 switches on the switch S2 through the inverter circuit 53 when the drive signal Sg is low so as to set a sense-emitter voltage Vse of the sense node "b" to be a high level, thereby stepping up a voltage VM of the connection node "a" through the sense diode D2. That is, the deterioration detection of the switching element S1 or the main diode D1 can be performed in a period in which the switching element S1 is switched off.

The gate driving circuit 40 sets the gate voltage Vge of the gate terminal G to be a high level so as to switch on the switching element S1 when the drive signal Sg is high. The leak current detection circuit 54 switches off the switch S2 through the inverter circuit 53 when the drive signal Sg is high so as to set the sense-emitter voltage Vse of the sense node "b" to be a low level, thereby stepping down the voltage VM of the connection node "a" through the sense diode D2. That is, the deterioration detection of the switching element S1 or the main diode D1 can be stopped in a period in which the switching element S1 is switched on.

Figure 4:
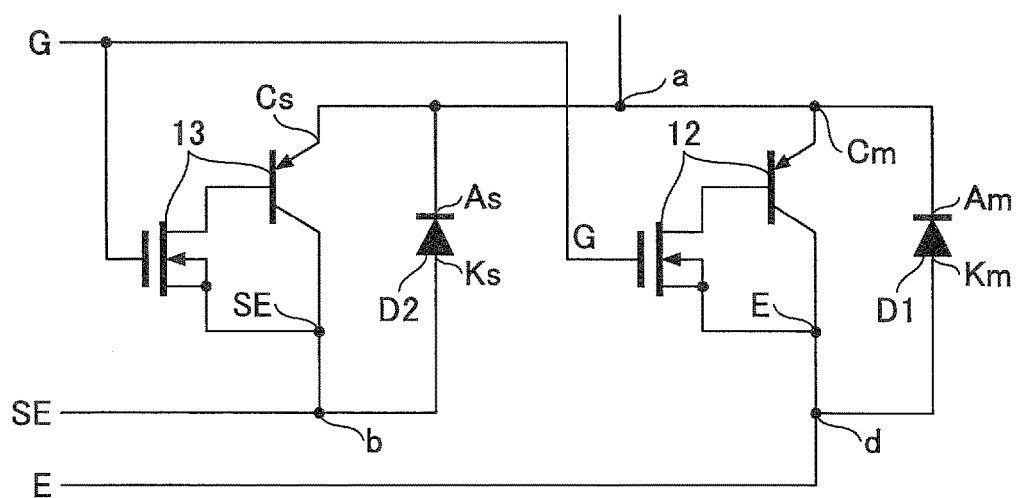
FIG. 4 is a circuit diagram for illustrating an example of a switching element.

FIG. 4 is a circuit diagram for illustrating an example of the switching element S1. For example, the switching element S1 is formed as a diode built-in IGBT in which the main transistor 12, sense transistor 13, the main diode D1 and the sense diode D2 are disposed on the common chip 20. In the diode built-in IGBT, the anode electrodes of the diodes and the emitter electrodes of the IGBTs form common electrodes and the cathode electrodes of the diodes and the collector electrodes of the IGBTs form common electrodes. The diode built-in IGBT is also referred to as "RC (Reverse Conducting)-IGBT".

The main transistor 12 and the sense transistor 13 may be respectively expressed by a PNP bipolar transistor and a n-channel MOSFET (Metal Oxide Semiconductor Field Effect Transistor).

Figure 5:
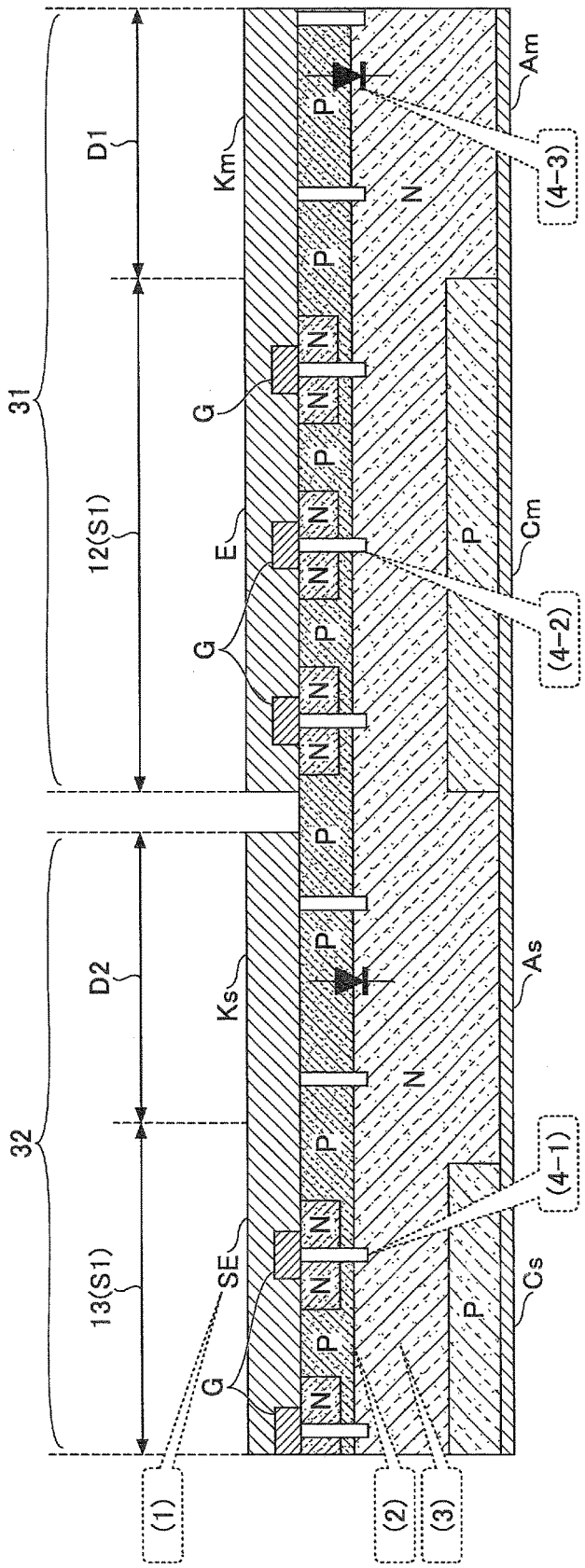
FIG. 5 is a diagram for showing a cross-sectional view for schematically illustrating an example configuration of the switching element.

FIG. 5 is a diagram for showing a cross-sectional view for schematically illustrating an example configuration of the switching element S1 (RC-IGBT) shown in FIG. 4. The main transistor 12 and the main diode D1 are formed on a main cell 31 of the chip 20, while the sense transistor 13 and the sense diode D2 are formed on a sense cell 32 of the chip 20. The main cell 31 and the sense cell 32 formed on the chip 20 are adjacent to each other.

In a case where the deterioration detection is performed, the switching element S1 is switched off since the gate voltage Vge of the gate terminal G is reduced. That is, the main transistor 12 and the sense transistor 13 are switched off.

(1) The voltage is applied to an emitter of the sense cell 32 (that is, the sense-emitter electrode SE of the sense transistor 13 and the cathode $K_s$ of the sense diode D2).

(2) The forward current flows in PN junctions of the sense transistor 13 and the sense diode D2.

(3) An internal (N-type region) voltage of the chip 20 is raised by the forward current flowing in PN junctions.

(4-1) A voltage is applied between the gate electrode G and the collector electrode $C_s$ of the sense transistor 13 according to the raised voltage in the N-type region. Thus, the deterioration in an oxide film disposed between the gate electrode G and the collector electrode $C_s$ of the sense transistor 13 can be detected.

(4-2) A voltage is applied between the gate electrode G and the collector electrode $C_m$ of the main transistor 12 according to the raised voltage in the N-type region. Thus, the deterioration in the oxide film disposed between the gate electrode G and the collector electrode $C_m$ of the main transistor 12 can be detected.

(4-3) A reverse bias (a voltage in a direction opposite to the forward direction of the main diode D1) is applied to the main diode D1 according to the raised voltage in the N-type region. Thus, the deterioration in the PN junction of the main diode D1 can be detected.

Figure 6:
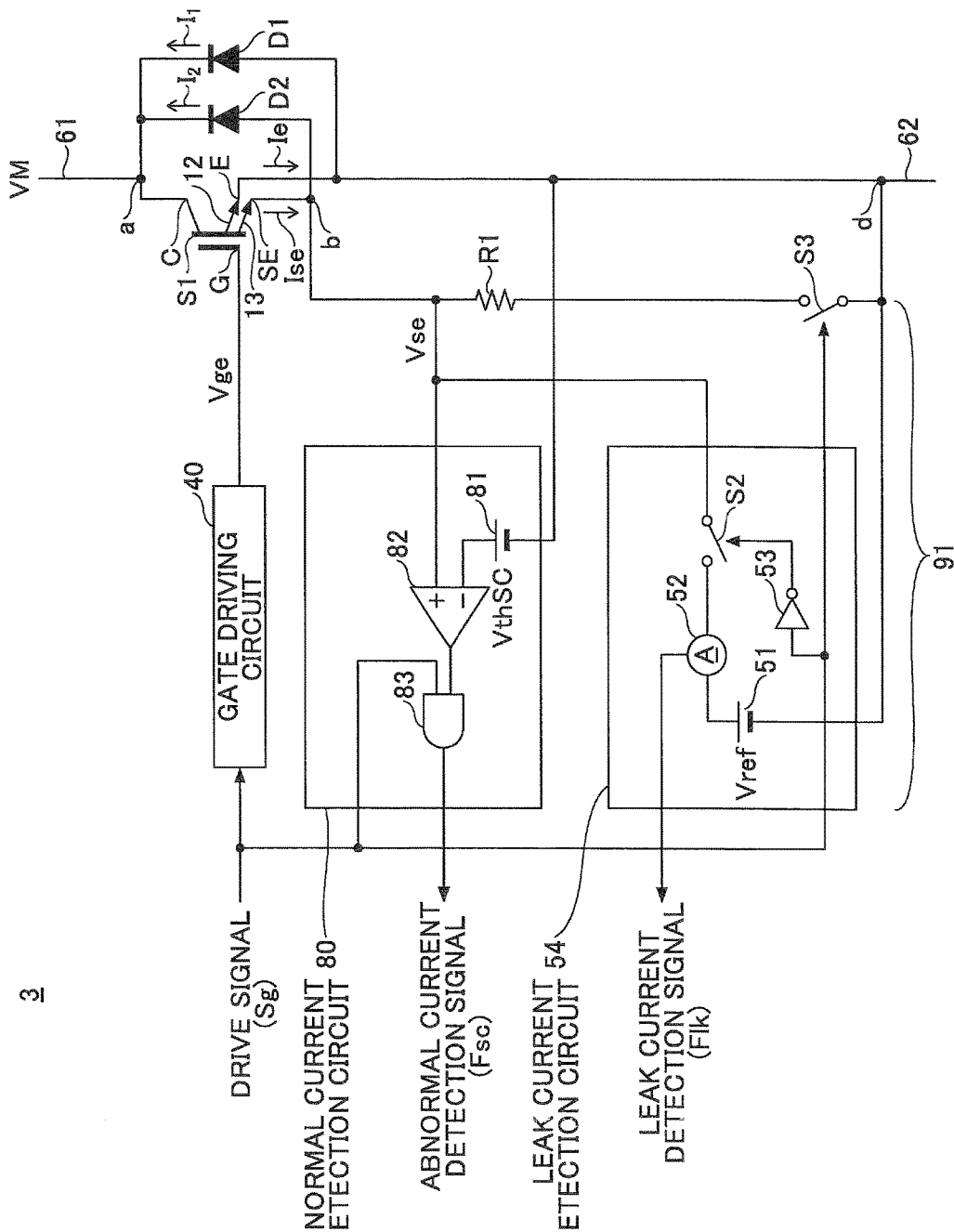
FIG. 6 is a diagram for illustrating another example configuration of the semiconductor apparatus.

FIG. 6 is a diagram for illustrating an example configuration of a driving apparatus 3 which is an example of the semiconductor apparatus. Description on a similar configuration or a similar effect to the aforementioned embodiment is omitted. The driving apparatus 3 has a deterioration detection function and an abnormal current detection function. The driving apparatus 3 includes a control circuit 91 for driving the switching element S1 and for detecting the deterioration and the abnormal current. For example, the control circuit 91 includes a resistor R1, an abnormal current detection circuit 80 and a switch S3 as well as the gate driving circuit 40 and the leak current detection circuit 54.

As described above, the leak current detection circuit 54 detects at least one of the deterioration (leak detection) of the switching element S1 and the deterioration of the main diode D1 by monitoring the forward current $I_2$ flowing through the sense node "b" during the OFF period of the switching element S1. Meanwhile, the abnormal current detection circuit 80 detects the abnormal current (for example, overcurrent or short-circuiting current) in the main transistor 12 by monitoring the sense-emitter voltage Vse of the sense node "b" using a comparator 82 during the ON period of the switching element S1. For example, the sense-emitter voltage Vse is generated across the resistor R1 in response to a flow of sense current Ise in the resistor R1.

The resistor R1 is a sense resistor connected between the sense node "b" and the connection node "d". The connection node "d" is a connecting point between the emitter electrode of the main transistor 12 and the anode of the main diode D1.

The abnormal current detection circuit 80 is an example of an abnormality detection unit for detecting an abnormality of the main current Ie flowing in the main transistor 12 based on a positive sense-emitter voltage Vse generated in response to the flow of sense current Ise in the resistor R1.

For example, when the main transistor 12 is energized, the abnormal current detection circuit 80 can determine whether the main current Ie is an overcurrent or not by comparing the positive sense-emitter voltage Vse generated in response to the flow of the sense current Ise in the resistor R1 with a predetermined reference voltage VthSC. The comparator 82 compares the sense-emitter voltage Vse with the predetermined reference voltage VthSC generated by a voltage source 81. For example, abnormal current detection circuit 80 determines that the main current Ie is overcurrent and outputs a high level signal from the comparator 82 in a case where the positive sense-emitter voltage Vse exceeds the reference voltage VthSC.

The switch S3 is an example of a shut-off unit for shutting-off the flow of the sense current Ise in the resistor R1 during the OFF period of the switching element S1. For example, the switch S3 is a transistor connected in series between the resistor R1 and the connection node "d".

Figure 7:
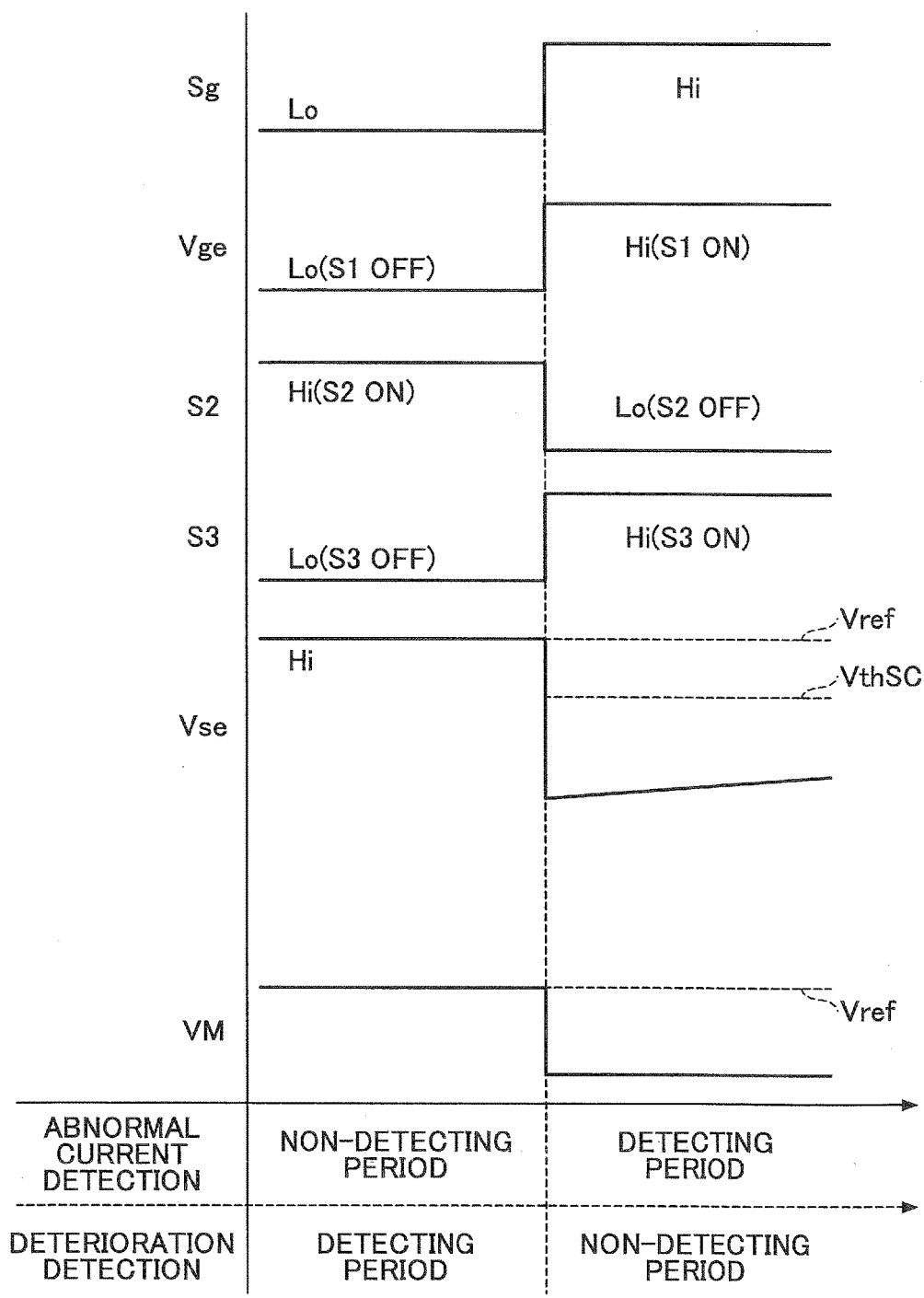
FIG. 7 is a timing diagram for illustrating an example of an operational waveform of the semiconductor apparatus.

FIG. 7 is a timing diagram for illustrating an example of an operational waveform of the driving apparatus 3. An operation of the driving apparatus 3 shown in FIG. 6 is described with reference to FIG. 7.

When the drive signal Sg is low which indicates an instruction for switching off the switching element S1, the switch S2 is switched on while the switch S3 is switched off. In this case, the leak current detection circuit 54 detects the deterioration as described above. Malfunction of the leak current detection circuit 54 can be prevented since a failure to apply the proper voltage Vref to the sense node "b" caused by dividing the voltage Vref by the resistor R1 is prevented by switching off the switch S3.

Meanwhile, when the low level drive signal Sg, which indicates an instruction for switching off the switching element S1, is input to an AND circuit 83, the abnormal current detection circuit 80 outputs a low level abnormal current detection signal Fsc regardless of level of output of the comparator 82. That is, the AND circuit 83 can invalidate the abnormal current detection function of the abnormal current detection circuit 80. For example, the comparator 82 outputs a high level signal indicating that the main current Ie is overcurrent in a case where the voltage Vref is greater than the reference voltage VthSC. However, since the AND circuit 83 can fix the abnormal current detection signal Fsc at low level (indicating that the main current Ie is not overcurrent), a false detection of the abnormal current caused by malfunction of the comparator 82 can be prevented.

When the drive signal Sg is high which indicates an instruction for switching on the switching element S1, the switch S2 is switched off while the switch S3 is switched on. By switching off the switch S2, the voltage Vref is not applied to the sense node "b". Therefore, as described above, the leak current detection circuit 54 does not detect the deterioration. That is, the switch S2 can invalidate the leak current detection function of the leak current detection circuit 54.

Meanwhile, when the high level drive signal Sg, which indicates an instruction for switching on the switching element S1, is input to the AND circuit 83, the abnormal current detection circuit 80 outputs a high level (which is the same logic level of output of the comparator 82) abnormal current detection signal Fsc. By switching on the switch S3, the flow of the sense current Ise in the resistor R1 is permitted. Therefore, the abnormal current detection circuit 80 outputs the signal, which is output from the comparator 82 based on the detected sense-emitter voltage Vse, as the abnormal current detection signal Fsc.

When the high level abnormal current detection signal Fsc is output, the switching element S1 is switched off by the gate driving circuit 40. The abnormal flow of the main current Ie can be shut-off since the main transistor 12 and the sense transistor 13 are switched off upon the switching element S1 being switched off.

As described above, a terminal can be shared for detecting the deterioration and detecting the abnormal current since the sense node "b" has a function for detecting the deterioration and a function for detecting the abnormal current. Also lines connected with the terminal can be shared when the terminal is shared.

Figure 8:
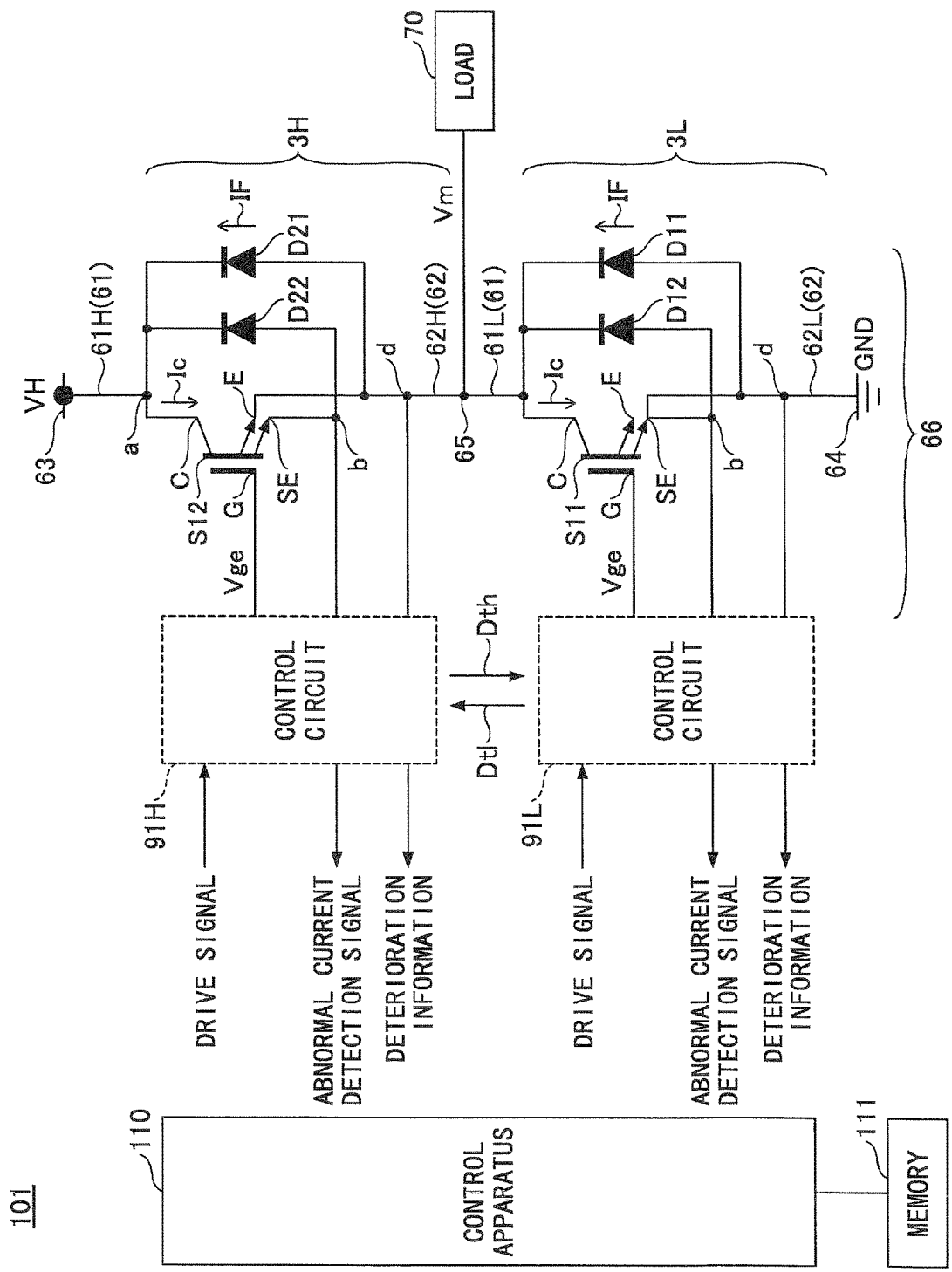
FIG. 8 is a diagram for illustrating an example configuration of a power conversion apparatus.

FIG. 8 is a diagram for illustrating an example configuration of a power conversion apparatus 101 including a plurality of the driving apparatuses. Description on a similar configuration or a similar effect to the aforementioned embodiment is omitted.

The power conversion apparatus 101 includes an arm circuit 66 in which two driving apparatuses 3L and 3H and transistors connected in series are included wherein the transistors are respectively disposed in a high side arm and low side arm with respect to a central node 65 to which an inductive load 70 is connected. The power conversion apparatus 101 includes three arm circuits 66 corresponding to the number of phases of a three-phase motor in a case where it is used as an inverter for driving the three-phase motor.

An inducting unit 61H connected with a high side switching element S12 is electrically connected with a high power supply potential part 63. An inducting unit 62H connected with the switching element S12 is indirectly connected to a low power supply potential part 64 through a low side switching element S11 or the load 70. Meanwhile, an inducting unit 62L connected with a low side switching element S11 is electrically connected with a low power supply potential part 64. An inducting unit 61L connected with the switching element S11 is indirectly connected to the high power supply potential part 63 through the switching element S12 or the load 70.

The driving apparatuses 3L and 3H are respectively examples of the semiconductor apparatus. For example, in a case where the driving apparatuses 3L and 3H have the same circuit configuration as that of the driving apparatus 3 shown in FIG. 6, the control circuits 91H and 91L shown in FIG. 8 have the same circuit configuration as that of the control circuit 91 shown in FIG. 6. Additionally, the driving apparatuses 3L and 3H may have the same circuit configuration as those of other embodiments.

For example, the power conversion apparatus 101 includes a control apparatus 110 externally connected to the driving apparatuses 3H and 3L in higher order than the drive apparatuses 3H and 3L. The gate driving circuit 40 included in a high side control circuit 91H switches on/off the switching element S12 disposed in the same side according to the drive signal (for example, a pulse width modulation signal) provided from the control apparatus 110. The gate driving circuit 40 included in a low side control circuit 91L switches on/off the switching element S11 disposed in the same side according to the drive signal (for example, a pulse width modulation signal) provided from the control apparatus 110. For example, the control apparatus 110 is a microcomputer or an apparatus including a microcomputer.

The control apparatus 110 performs a certain control based on the deterioration information output from the leak current detection circuit 54 included in the high side control circuit 91H or the leak current detection circuit 54 included in the low side control circuit 91L. For example, the control apparatus 110 performs a control in which the deterioration information from the respective leak current detection circuits 54 is sent to an external destination or retrievably stored in a memory 111. By performing the control, for example, the deterioration information can be reported to the user.

Figure 9:
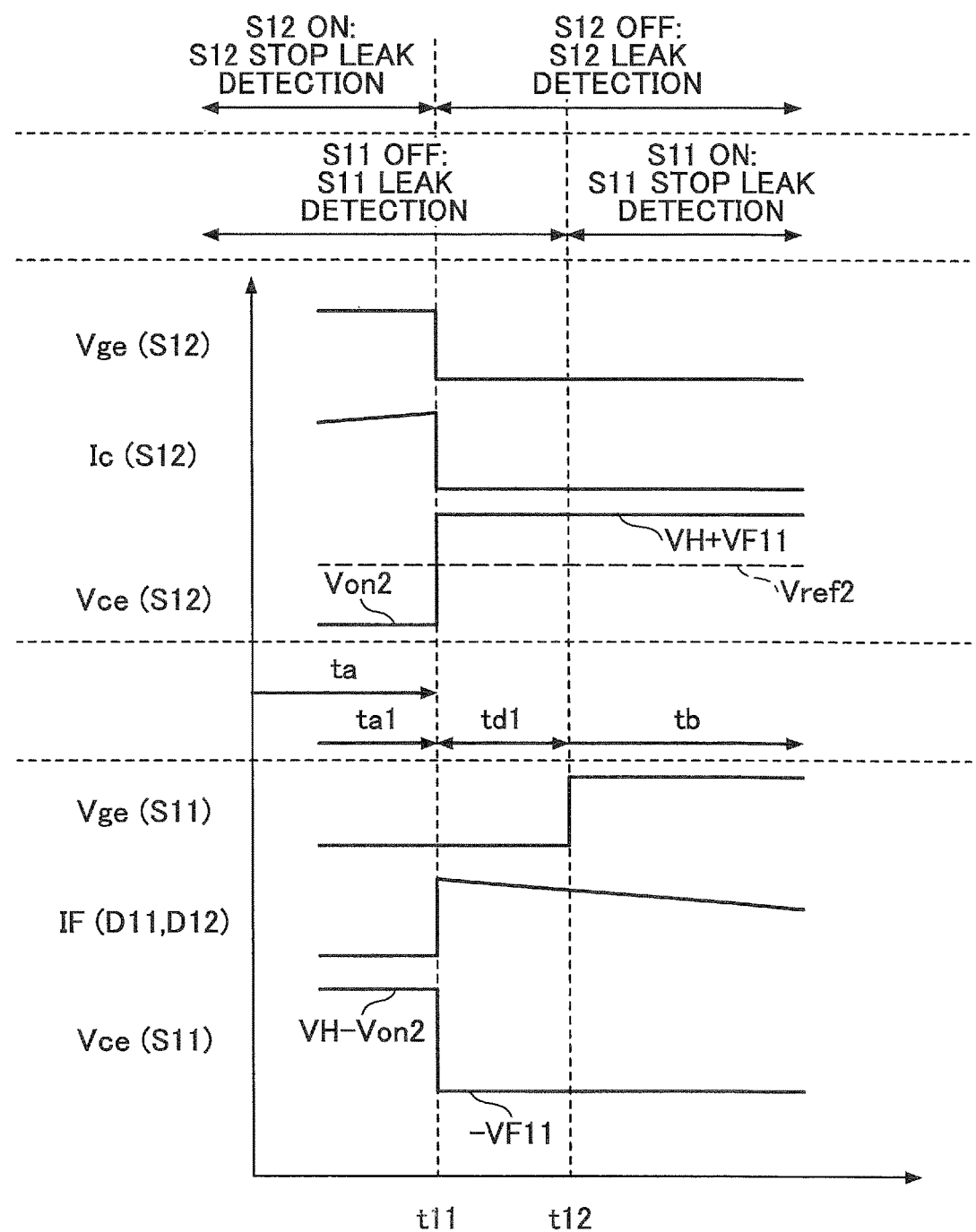
FIG. 9 is a timing diagram for illustrating an example of an operational waveform of the power conversion apparatus when current is supplied from the power conversion apparatus to a load.

FIG. 9 is a timing diagram for illustrating an example of an operational waveform of the power conversion apparatus 101 when current is supplied from the power conversion apparatus 101 to the load 70. "Vge" indicates a voltage (gate voltage) between the gate terminal G and the emitter terminal E of the switching element. "Ic" indicates collector current (almost equal to the aforementioned main current Ie) of the switching element. "Vice" indicates a voltage between a collector terminal C and an emitter terminal E of the switching element. "IF" indicates forward current in the diode. "Von2" indicates a voltage between the collector terminal C and the emitter terminal E in the ON period of the switching element S12. "VH" indicates power supply voltage of the high power supply potential part 63. "VF11" indicates the voltage of the main diode D11 in a forward direction.

In the following, an operation of the power conversion apparatus 101 shown in FIG. 8 when the current is supplied from the power conversion apparatus 101 to the load 70 will be described with reference to FIG. 9.

The switching elements S11 and S12 are switched on when the respective gate voltages Vge are high and switched off when the respective gate voltages Vge are low.

The leak current detection circuit 54 included in the low side control circuit 91L detects the deterioration (leak) during the OFF period of the switching element S11 and stops detecting the deterioration during the ON period of the switching element S11 in accordance with the drive signal for switching on/off the switching element S11. Similarly, the leak current detection circuit 54 included in the high side control circuit 91H detects the deterioration (leak) during the OFF period of the switching element S12 and stops detecting the deterioration during the ON period of the switching element S12 in accordance with the drive signal for switching on/off the switching element S12.

The control apparatus 110 performs the certain control based on the deterioration information output from the low side leak current detection circuit 54 during a term ta. The term ta means a term from timing at which the drive signal for switching the low side switching element S11 from on to off is output by the control apparatus 110 to timing t11 at which the drive signal for switching the high side switching element S12 from on to off is output by the control apparatus 110. Since "Vce" of the switching element S11 is relatively high during the term ta, the leak current detection circuit 54 can properly perform the deterioration detection in the term ta, and thereby outputs the deterioration information of the deterioration detected in the term ta. Therefore, the control apparatus 110 can properly perform the certain control based on the proper deterioration information output from the low side leak current detection circuit 54 during the term ta.

For example, during the term ta1 (included in the term ta) in which the OFF period of the low side switching element S11 is overlapped with the ON period of the high side switching element S12, "Vce" of the switching element S11 becomes "VH−Von2". "VH" is sufficiently higher than "Von2". The term ta1 means a term from timing at which the drive signal for switching the high side switching element S12 from off to on is output by the control apparatus 110 to timing t11 at which the drive signal for switching the high side switching element S12 from on to off is output by the control apparatus 110. In the term ta1, the current is applied from the high side switching element S12 to the load 70 through the central node 65. The low side leak current detection circuit 54 can properly perform the deterioration detection by applying a voltage to the low side sense node "b" during the term ta1 in which the voltage "VH−Von2" is applied to the switching element S11 and the main diode D11. Therefore, the control apparatus 110 can properly perform the certain control based on the proper deterioration information output from the low side leak current detection circuit 54 during the term ta1.

Meanwhile, the control apparatus 110 invalidates the deterioration information output from the low side leak current detection circuit 54 during a dead term td1. The dead term td1 means a term from timing t11 at which the drive signal for switching the high side switching element S12 from on to off is output by the control apparatus 110 to timing t12 at which the drive signal for switching the low side switching element S11 from off to on is output by the control apparatus 110. In the dead term td1, forward current IF is returned to the load 70 from the low side main diode D11 and the low side sense diode D12 through the central node 65. During the dead term td1, "Vice" of the switching element S11 is reduced from "VH−Von2" to "−VF11". Thus, the low side leak current detection circuit 54 falsely detects the deterioration since the voltage is applied to the sense node "b" during the dead term td1 causing current to flow in the sense diode D12. Therefore, the control apparatus 110 invalidates the deterioration information output from the low side leak current detection circuit 54 during the dead term td1, and thereby prevents performing the certain operation based on false deterioration information.

For example, the control apparatus 110 stops sending the deterioration information to an external destination or storing it in memory 111 so as to invalidate the deterioration information output from the low side leak current detection circuit 54 during the dead term td1. By performing such control for invalidating the deterioration information, false notification thereof to the user can be prevented.

Also, the low side leak current detection circuit 54 may acquire a timing signal Dth for reporting timing t11 at which the dead term td1 is started from the control circuit 91H included in the high side driving apparatus 3H, thereby stops outputting the deterioration information of the deterioration detected during the dead term td1. Thus, the low side leak current detection circuit 54 can prevent conveyance of the false deterioration information to the control apparatus 110.

Additionally, the low side leak current detection circuit 54 can detect timing (for example, timing t11 at which the dead term td1 starts) at which the high side switching element S12 is turned off by acquiring the timing signal Dth. Also, the low side leak current detection circuit 54 can detect timing at which the switching element S11 switches from on to off or from off to on by acquiring the drive signal for switching on/off the low side switching element S11. For example, the low side leak current detection circuit 54 can detect timing t12 at which the dead term td1 ends by acquiring the drive signal for switching the low side switching element S11 from off to on.

Also, during a term tb, a voltage "VH+VF11" is applied to the switching element S12 and the main diode D21. Further, during the term tb, a voltage VH is applied to the sense diode D22 (to be exact, "VH+VF11−Vref2" is applied. However, VH is significantly greater than VF11 or Vref2.). "Vref2" is a voltage applied to the high side sense node b. In the term tb, the forward current IF is returned to the load 70 from the low side main diode D11 and the low side sense diode D12 through the central node 65 and the OFF period of the switching element S12 is overlapped with the ON period of the switching element S11.

If the sense diode D22 is deteriorated, current flows in a direction opposite to the forward direction of the sense diode D22 in response to applying the voltage VH to the sense diode D22. Therefore, the high side leak current detection circuit 54 can detect the deterioration of the sense diode D22 based on backward current flowing in the high side sense diode D22 during the term tb.

Additionally, the high side leak current detection circuit 54 can detect timing (for example, timing t12 at which the dead term td1 ends) at which the low side switching element S11 switches from off to on by acquiring a timing signal Dt1 from the control circuit 91L included in the low side driving apparatus 3L.

Figure 10:
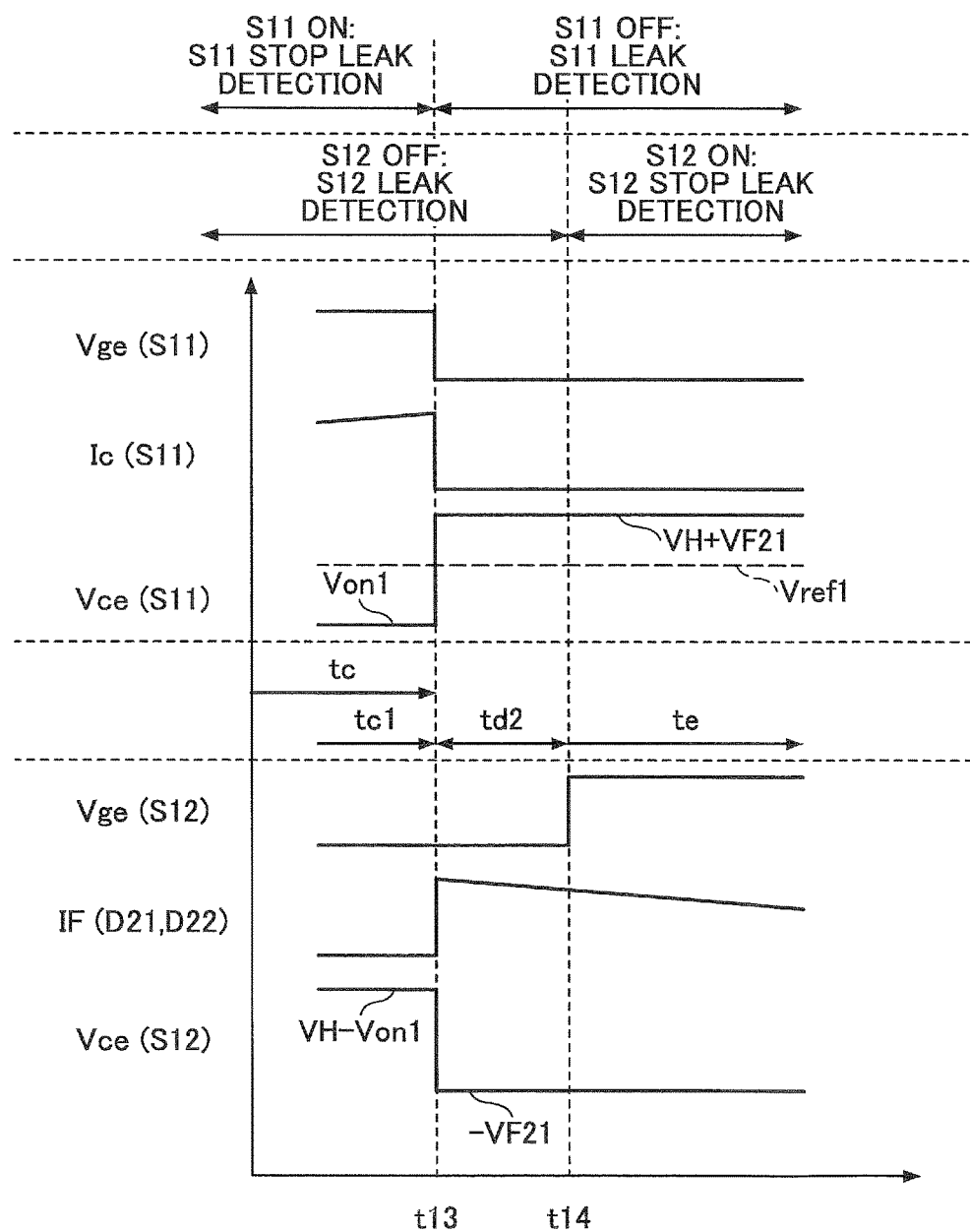
FIG. 10 is a timing diagram for illustrating an example of an operational waveform of the power conversion apparatus when current is returned from the load to the power conversion apparatus.

FIG. 10 is a timing diagram for illustrating an example of an operational waveform of the power conversion apparatus 101 when current is returned from the load 70 to the power conversion apparatus 101. "Vge", "Ic", "Vice", "IF" and "VH" are respectively the same as described with reference to FIG. 9. "Von1" is a voltage between the collector terminal C and the emitter terminal E during the ON period of the switching element S11. The VF21 is a forward voltage of the main diode D21.

In the following, an operation of the power conversion apparatus 101 shown in FIG. 8 when the current is returned from the load 70 to the power conversion apparatus 101 will be described with reference to FIG. 10.

The control apparatus 110 performs the certain control based on the deterioration information output from the high side leak current detection circuit 54 during a term tc. The term tc means a term from timing at which the drive signal for switching the high side switching element S12 from on to off is output by the control apparatus 110 to timing t13 at which the drive signal for switching the low side switching element S11 from on to off is output by the control apparatus 110. Since "Vice" of the switching element S12 is relatively high during the term tc, the high side leak current detection circuit 54 can properly perform the deterioration detection in the term tc, and thereby outputs the deterioration information of the deterioration detected in the term tc. Therefore, the control apparatus 110 can properly perform the certain control based on the proper deterioration information output from the high side leak current detection circuit 54 during the term tc.

For example, during the term tc1 (included in the term tc) in which the OFF period of the high side switching element S12 is overlapped with the ON period of the low side switching element S11, "Vice" of the switching element S12 becomes "VH−Von1". "VH" is sufficiently higher than "Von1". The term tc1 means a term from timing at which the drive signal for switching the low side switching element S11 from off to on is output by the control apparatus 110 to timing t13 at which the drive signal for switching the low side switching element S11 from on to off is output by the control apparatus 110. In the term tc1, the current is supplied from the load 70 to the low side switching element S11 through the central node 65. The high side leak current detection circuit 54 can properly perform the deterioration detection by applying a voltage to the high side sense node "b" during the term tc1 in which the voltage "VH−Von1" is applied to the switching element S12 and the main diode D21. Therefore, the control apparatus 110 can properly perform the certain control based on the proper deterioration information output from the high side leak current detection circuit 54 during the term tc1.

Meanwhile, the control apparatus 110 invalidates the deterioration information output from the high side leak current detection circuit 54 during a dead term td2. The dead term td2 means a term from timing t13 at which the drive signal for switching the low side switching element S11 from on to off is output by the control apparatus 110 to timing t14 at which the drive signal for switching the high side switching element S12 from off to on is output by the control apparatus 110. In the dead term td2, forward current IF is returned to the high side main diode D21 and the high side sense diode D22 from the load 70 through the central node 65. During the dead term td2, "Vice" of the switching element S12 is reduced from "VH−Von1" to "−VF21". Thus, the high side leak current detection circuit 54 falsely detects the deterioration since the voltage is applied to the sense node "b" during the dead term td2 causing current to flow in the sense diode D22. Therefore, the control apparatus 110 invalidates the deterioration information output from the high side leak current detection circuit 54 during the dead term td2, and thereby prevents performing the certain operation based on false deterioration information.

For example, the control apparatus 110 stops sending the deterioration information to an external destination or storing it in memory 111 so as to invalidate the deterioration information output from the high side leak current detection circuit 54 during the dead term td2. By performing such control for invalidating the deterioration information, false notification thereof to the user can be prevented.

Also, the high side leak current detection circuit 54 may acquire a timing signal Dth for reporting timing t13 at which the dead term td2 is started from the control circuit 91L included in the low side driving apparatus 3L, and thereby stops outputting the deterioration information of the deterioration detected during the dead term td2. Thus, the high side leak current detection circuit 54 can prevent conveyance of the false deterioration information to the control apparatus 110.

Additionally, the high side leak current detection circuit 54 can detect timing (for example, timing t13 at which the dead term td2 starts) at which the low side switching element S11 is turned off by acquiring the timing signal Dt1. Also, the high side leak current detection circuit 54 can detect timing at which the switching element S12 switches from on to off or from off to on by acquiring the drive signal for switching on/off the high side switching element S12. For example, the high side leak current detection circuit 54 can detect timing t14 at which the dead term td2 ends by acquiring the drive signal for switching the high side switching element S12 from off to on.

Also, during a term te, a voltage "VH+VF21" is applied to the switching element S11 and the main diode D11. Further, during the term te, a voltage VH is applied to the sense diode D12 (to be exact, "VH+VF21−Vref1" is applied. However, VH is significantly greater than VF21 or Vref1.). "Vref1" is a voltage applied to the low side sense node b. In the term te, the forward current IF is returned to the high side main diode D21 and the high side sense diode D22 from the load 70 through the central node 65 and the OFF period of the switching element S11 is overlapped with the ON period of the switching element S12.

If the sense diode D12 is deteriorated, current flows in a direction opposite to the forward direction of the sense diode D12 in response to applying the voltage VH to the sense diode D12. Therefore, the low side leak current detection circuit 54 can detect the deterioration of the sense diode D12 based on backward current flowing in the low side sense diode D12 during the term te.

Additionally, the low side leak current detection circuit 54 can detect timing (for example, timing t14 at which the dead term td2 ends) at which the high side switching element S12 switches from off to on by acquiring a timing signal Dth from the control circuit 91H included in high side driving apparatus 3H.

By the way, in FIG. 8, due to noise or the like generated when the driving apparatuses 3H and 3L drive the load 70, there is a case where the deterioration cannot be stably detected. In such case, the high side and low side leak current detection circuits 54 may perform the deterioration detection only in a period (hereinafter referred to as "system stop period") in which the driving apparatuses 3H and 3L do not drive the load 70. A period in which the operation of the load 70 is stopped (load stop period), a period in which the vehicle using the load 70 as the power source is stopped (vehicle stop period), a period in which the power conversion apparatus 101 start to be activated (system start period) and the like can be exemplified as the system stop period.

Figure 11:
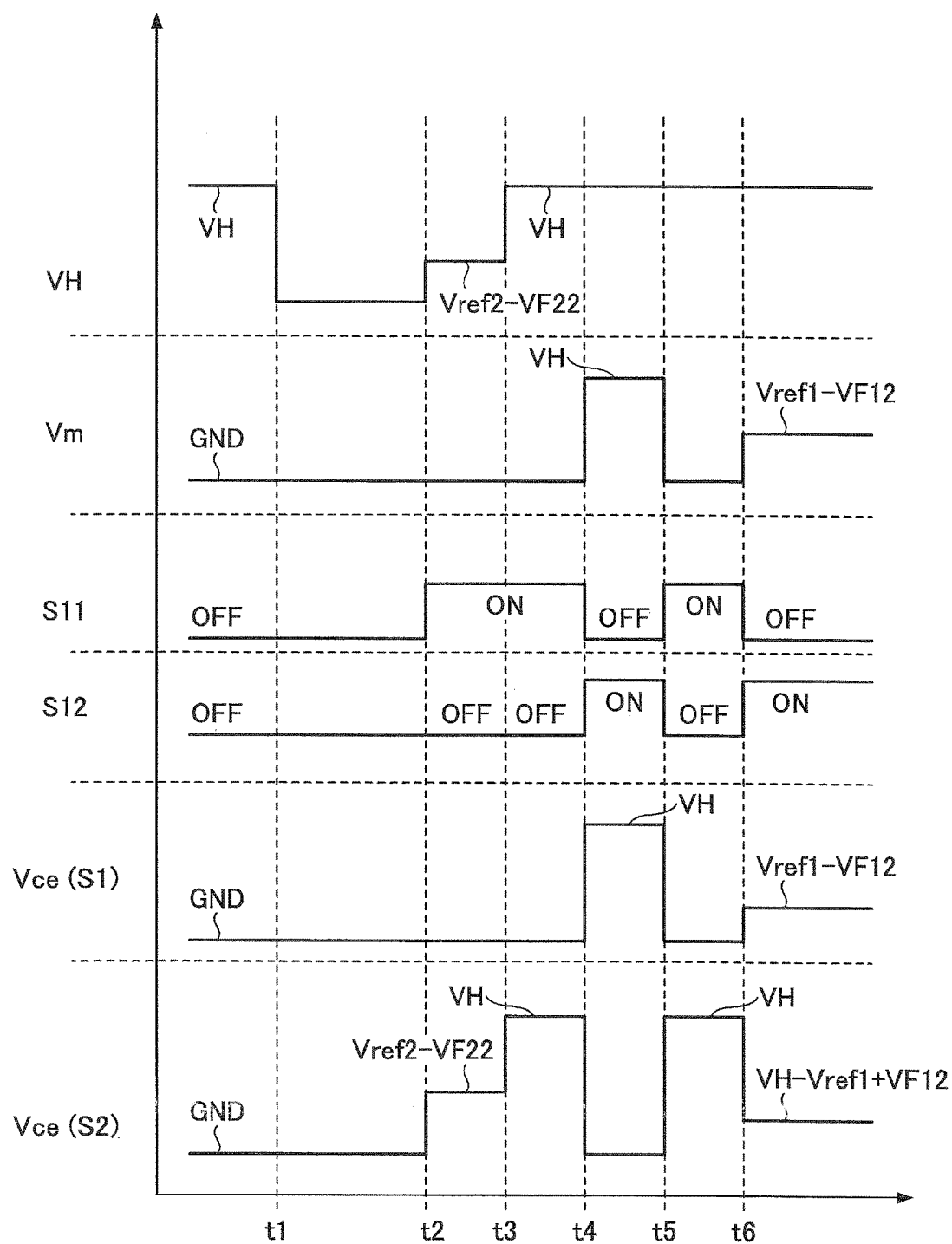
FIG. 11 is a timing diagram for illustrating an example of an operational waveform of a deterioration detection performed by the power conversion apparatus.

FIG. 11 is a timing diagram for illustrating an example of an operational waveform of the deterioration detection performed by the power conversion apparatus in the system stop period.

Timing t1: the switching elements S11 and S12 are switched off when the deterioration detection is started in the system stop period. In a case where the system stop period is the load stop period or the vehicle stop period, the control apparatus 110 reduce the voltage VH to GND (ground voltage), and in a case where the system stop period is the system start period, the control apparatus 110 keeps the voltage VH to be the ground voltage.

Timing t2: the control apparatus 110 switches the low side switching element S11 from off to on and keeps the high side switching element S12 to be in off state. The high side leak current detection circuit 54 applies the voltage Vref2 to the high side sense node "b". Thus, the collector voltage (VH) of the switching element S12 is reduced from the voltage Vref2 of the sense node "b" by a forward voltage VF22 of the sense diode D22 to become a voltage "Vref2−VF22". Therefore, the high side leak current detection circuit 54 can stably perform the deterioration detection of the switching element S12 or the main diode D21 to which the voltage "Vref2−VF22" is applied since the high power supply potential part 63 is stable in the system stop period.

Timing t3: the control apparatus 110 raises the voltage VH of the high power supply potential part 63 to the proper voltage by using a battery (not shown) or converter. Thus, a reverse bias ("VH−Vref2") is applied to the sense diode D22. Therefore, the high side leak current detection circuit 54 can stably perform the deterioration detection of the sense diode D22 by monitoring the backward current flowing in the sense diode D22 since the high power supply potential part 63 is stable in the system stop period.

Timing t4: the control apparatus 110 switches the high side switching element S12 from off to on while switching the low side switching element S11 from on to off. Thus, the collector voltage of the switching element S11 is raised to the voltage VH which causes applying the reverse bias (VH) to the sense diode D12. Therefore, the low side leak current detection circuit 54 can stably perform the deterioration detection of the sense diode D12 by monitoring the backward current flowing in the sense diode D12 since the high power supply potential part 63 is stable in the system stop period.

Timing t5: the control apparatus 110 switches the low side switching element S11 from off to on while switching the high side switching element S12 from on to off. Then, the voltage Vm of the central node 65 (voltage Vice of the switching element S11) is reduced to the ground voltage.

Timing t6: the control apparatus 110 switches the high side switching element S12 from off to on while switching the low side switching element S11 from on to off. The low side leak current detection circuit 54 applies the voltage Vref1 to the low side sense node "b". Thus, the collector voltage (Vm) of the switching element S11 is reduced from the voltage Vref1 of the sense node "b" by a forward voltage VF12 of the sense diode D12 to become a voltage "Vref1−VF12". Therefore, the low side leak current detection circuit 54 can stably perform the deterioration detection of the switching element S11 or the main diode nil to which the voltage "Vref1−VF12" is applied since the high power supply potential part 63 is stable in the system stop period.

Herein above, although the semiconductor apparatus and the power conversion apparatus have been described with respect to a specific embodiment, the appended claims are not to be thus limited. It should be understood that the various changes, substitutions, and alterations could be made hereto without departing from the spirit and scope of the claims. Further, all or part of the components of the embodiments described above can be combined.

For example, the switching element such as the transistor may be a switching element other than the IGBT, and it may be a n-channel MOSFET (Metal Oxide Semiconductor Field Effect Transistor), a p-channel MOSFET or a NPN or PNP bipolar transistor. In a case where the MOSFET is used, "collector" should be replaced with "drain" and "emitter" should be replaced with "source" in the description of the embodiments, while in a case where the bipolar transistor is used, "gate" should be replaced with "base" in the description of the embodiments.

Also, in the embodiments, the sense diode D2 may be formed in a chip separated from the switching element S1, and the main diode D1 may be formed in a chip other than the chip 20.

The present application is based on Japanese Priority Application No. 2014-144420, filed on Jul. 14, 2014, the entire contents of which are hereby incorporated by reference.

What is claimed is:

1. A semiconductor apparatus comprising:
   an insulated-gate bipolar transistor (IGBT) including:
     a gate, to which a gate voltage from outside the IGBT is supplied that determines an OFF period of the IGBT;
   a main transistor including:
     a collector that is connected to a collector of the IGBT; and
     an emitter that is connected to an emitter of the IGBT; and
   a sense transistor including:
     a collector that is connected to the collector of the IGBT; and
     an emitter that is connected to a sense emitter of the IGBT;
   a main diode whose cathode is connected to the collector of the IGBT and whose anode is connected to the emitter of the IGBT;
   a sense diode whose cathode is connected to the collector of the IGBT and whose anode is connected to the sense emitter of the IGBT, the cathode of the sense diode being connected to the cathode of the main diode to detect current that flows through the main diode; and
   a deterioration detection circuit configured to apply a voltage to a sense node at which the sense emitter and the anode of the sense diode are connected, and that detects a deterioration of the IGBT or the main diode based on a forward current flowing in the sense diode, the forward current being detected while the voltage is applied, the voltage being applied during the OFF period of the IGBT.

2. The semiconductor apparatus as claimed in claim 1, wherein the sense diode is formed on a chip where the IGBT is formed.

3. The semiconductor apparatus as claimed in claim 1, wherein the gate voltage determines an ON period of the IGBT, and the deterioration detection circuit stops applying the voltage to the sense node during an ON period of the IGBT.

4. The semiconductor apparatus as claimed in claim 3, wherein
   the deterioration detection circuit applies the voltage to the sense node during the OFF period of the IGBT in response to a drive signal for turning on the IGBT, while stopping applying the voltage to the sense node during the ON period of the IGBT in response to a drive signal for turning off the IGBT.

5. The semiconductor apparatus as claimed in claim 1, wherein
   the deterioration detection circuit determines that at least one of the IGBT and the main diode is deteriorated when a value of the forward current is greater than a predetermined current value.

6. The semiconductor apparatus as claimed in claim 1, wherein
   the deterioration detection circuit determines that neither the IGBT nor the main diode are deteriorated when a value of the forward current is equal to or less than a predetermined current value.

7. The semiconductor apparatus as claimed in claim 1, further comprising:
   a resistor connected between the sense node and a connection node at which the emitter of the main transistor and the anode of the main diode are connected;
   an abnormality detection unit configured to detect an abnormality of current flowing in the main transistor based on a voltage across the resistor when a current flows through the resistor; and
   a shut-off unit configured to prevent the current flowing through the resistor during the OFF period of the IGBT.

8. A power conversion apparatus comprising:
   two semiconductor apparatuses as claimed in claim 1 provided in series, one of the semiconductor apparatuses forming a high side semiconductor apparatus, and another of the semiconductor apparatuses forming a low side semiconductor apparatus; and
   a control device configured to perform a certain control based on deterioration information indicating the detection result of the deterioration detection circuit output by one of the high side semiconductor apparatus and the low side semiconductor apparatus during a term from timing at which the IGBT included in the one semiconductor apparatus switches from on to off to timing at which the IGBT included in the other semiconductor apparatus switches from on to off.

9. The power conversion apparatus as claimed in claim 8, wherein the control device invalidates the deterioration information output by the deterioration detection circuit included in one semiconductor apparatus during a dead term from timing at which the IGBT included in the other semiconductor apparatus switches from on to off to timing at which the IGBT included in the one semiconductor apparatus switches from off to on.

10. A power conversion apparatus comprising:
    two semiconductor apparatuses as claimed in claim 1 provided in series, one of the semiconductor apparatuses forming a high side semiconductor apparatus, and another of the semiconductor apparatuses forming a low side semiconductor apparatus,
    wherein the deterioration detection circuit included in one of the high side semiconductor apparatus and the low side semiconductor apparatus outputs deterioration information of the detected deteriorations, and the deterioration is detected during a term from timing at which the IGBT included in the one semiconductor apparatus switches from on to off to timing at which the IGBT included in the other semiconductor apparatus switches from on to off.

11. The power conversion apparatus as claimed in claim 10, wherein the deterioration detection circuit stops outputting the deterioration information of the deterioration detected during a dead term from timing at which the IGBT included in the other semiconductor apparatus switches from on to off to timing at which the IGBT included in one semiconductor apparatus switches from off to on.

12. A power conversion apparatus comprising:
    two semiconductor apparatuses as claimed in claim 1 provided in series, one of the semiconductor apparatuses forming a high side semiconductor apparatus, and another of the semiconductor apparatuses forming a low side semiconductor apparatus, wherein the deterioration detection circuit included in one of the high side semiconductor apparatus and the low side semiconductor apparatus detects a deterioration of the sense diode in the one of the semiconductor apparatuses based on a backward current flowing in the sense diode in the one semiconductor apparatus during a term in which the OFF period of the IGBT in the one semiconductor apparatus is overlapped with the ON period of the IGBT in the other semiconductor apparatus.

13. A power conversion apparatus comprising:
two semiconductor apparatuses as claimed in claim 1 provided in series, one of the semiconductor apparatuses forming a high side semiconductor apparatus, and another of the semiconductor apparatuses forming low side semiconductor apparatus,
wherein the deterioration detection circuits in the high side semiconductor apparatus and the low side semiconductor apparatus detect the deterioration only when the respective semiconductor apparatuses do not drive a load.

* * * * *